United States Patent
Itakura

(10) Patent No.: US 10,553,468 B2
(45) Date of Patent: Feb. 4, 2020

(54) SUBSTRATE STORING METHOD AND SUBSTRATE PROCESSING APPARATUS

(71) Applicant: Tokyo Electron Limited, Tokyo (JP)

(72) Inventor: Akira Itakura, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 323 days.

(21) Appl. No.: 15/213,618

(22) Filed: Jul. 19, 2016

(65) Prior Publication Data
US 2017/0032994 A1 Feb. 2, 2017

(30) Foreign Application Priority Data
Jul. 27, 2015 (JP) .................................. 2015-148146

(51) Int. Cl.
H01L 21/677 (2006.01)
H01L 21/673 (2006.01)

(52) U.S. Cl.
CPC .............................. H01L 21/67389 (2013.01)

(58) Field of Classification Search
CPC ..................... H01L 21/67389; H01L 21/67745
See application file for complete search history.

(56) References Cited

U.S. PATENT DOCUMENTS

| | | | | |
|---|---|---|---|---|
| 5,988,233 A * | 11/1999 | Fosnight | ........... | H01L 21/67393 141/63 |
| 8,731,698 B2 * | 5/2014 | Onodera | ........... | H01L 21/67778 700/100 |
| 9,305,817 B2 * | 4/2016 | Kaise | ................ | H01L 21/67772 |
| 2004/0062627 A1 * | 4/2004 | Aggarwal | ......... | H01L 21/67778 414/217 |
| 2006/0219171 A1 * | 10/2006 | Sasaki | ................ | C23C 16/4412 118/719 |
| 2015/0071739 A1 | 3/2015 | Nakamura et al. | | |

FOREIGN PATENT DOCUMENTS

| | | |
|---|---|---|
| JP | 2010-251655 | 11/2010 |
| JP | 2013-179287 | 9/2013 |
| TW | 201528420 | 7/2015 |

* cited by examiner

Primary Examiner — Jonathan Snelting
(74) Attorney, Agent, or Firm — IPUSA, PLLC

(57) ABSTRACT

A substrate processing apparatus includes a process module in which a substrate is processed, a first substrate storing container, a second substrate storing container, and a transferring module that conveys the substrate between locations connected by the transferring module, wherein the process module, the first substrate storing container, and the second substrate storing container are connected by the transferring module, the method including the successive steps of, conveying an unprocessed substrate stored in the first substrate storing container to the second substrate container, conveying the unprocessed substrate stored in the second substrate storing container to the process module to process the unprocessed substrate, conveying the processed substrate processed in the process module to the first substrate storing container, and introducing inactive gas into the first substrate storing container.

7 Claims, 6 Drawing Sheets

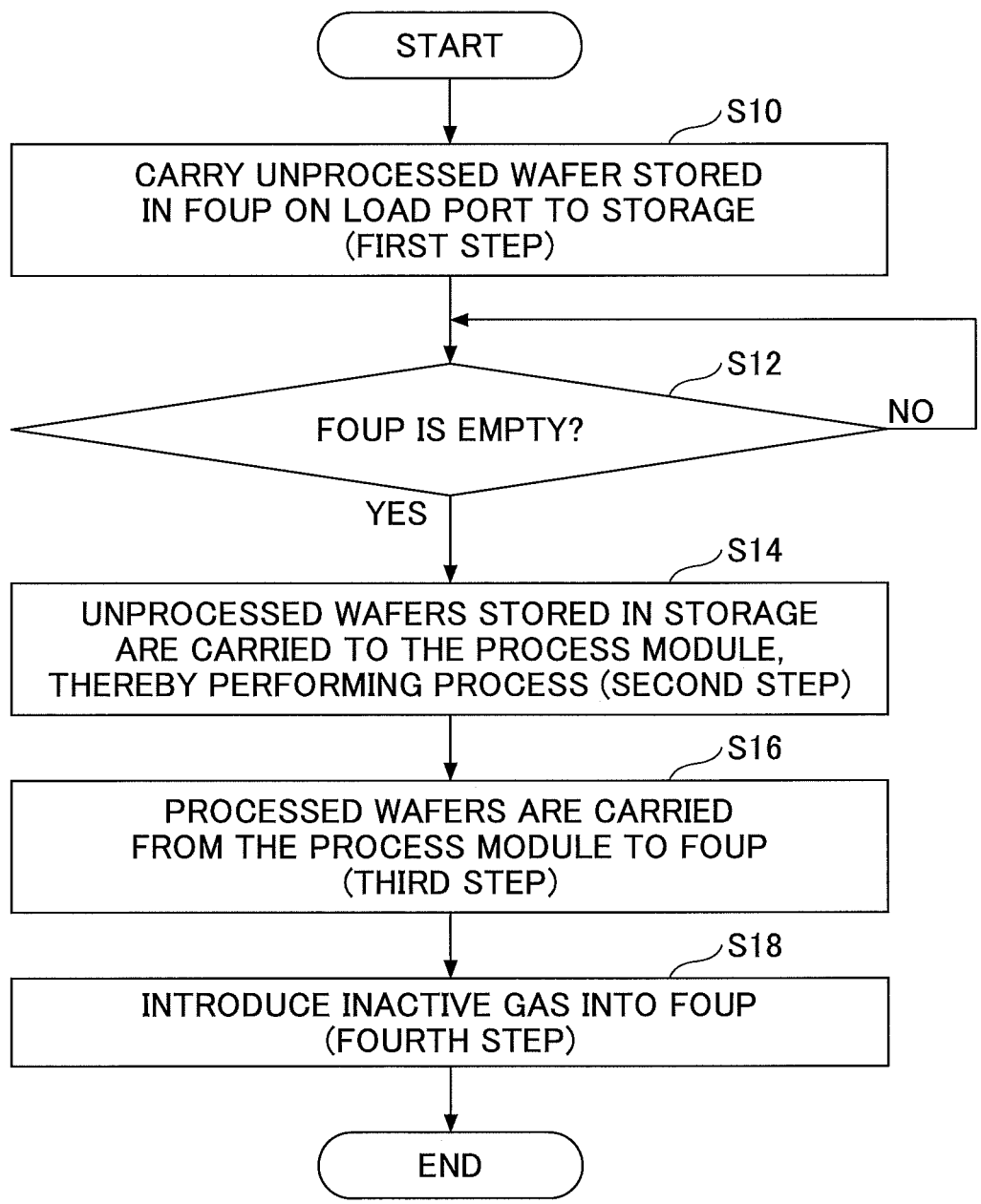

second group of unprocessed wafers on LP are carried to process module

SUBSTRATE STORING METHOD AND SUBSTRATE PROCESSING APPARATUS

CROSS-REFERENCE TO RELATED APPLICATION

The present application is based upon and claims the benefit of priority of Japanese Patent Application No. 2015-148146, filed on Jul. 27, 2015, the entire contents of which are incorporated by reference in their entirety.

BACKGROUND OF THE PRESENT INVENTION

1. Field of the present invention

The present disclosure relates to substrate storing methods and substrate processing apparatuses.

2. Description of the Related Art

There exists a FOUP (Front Opening Unified Pod) for storing and conveying a plurality of wafers. The FOUP is disposed at a load port (LP) provided in a substrate processing apparatus. Wafers in the FOUP are carried at a certain timing and processed in a processing chamber of the substrate processing apparatus. Then, the wafers are returned to the FOUP. If a processed wafer is returned to the FOUP before all of unprocessed wafers have been carried outside the FOUP, the processed wafer may be mixed with the unprocessed wafers. Therefore, defects may be found in devices formed on the wafers, or characteristics of the devices may vary.

In Patent Document 1, a method is proposed, in which the processed wafer is temporarily retracted to a storage area so as to avoid mixture of the unprocessed substrate and the processed substrate. In patent document 1, the processed wafer is returned from the storage area to the FOUP at timing when all of the unprocessed wafers are carried outside the FOUP. Also, in Patent Document 2, a method of N2 purging is disclosed, in which gas in the FOUP on the load port is replaced by N2 gas, thereby improving an atmosphere in the FOUP.

However, the storage area is a temporary space for storing the wafers. Therefore, service life of the device (hereinafter referred to as service life of wafer) formed on the wafer is reduced as a time during which the processed wafer is kept in the storage area becomes longer because defects or change of characteristics of the device may occur. For example, the replacement of gas by the N2 purging can be performed more locally in the FOUP in comparison to the storage area. Thus, effectiveness of N2 purging becomes greater in the FOUP than in the storage area. Hence, preferably, the time during which the wafer is kept in the storage area is reduced and the processed wafer is returned to the FOUP on the load port as soon as possible, in order to avoid the occurrence of defects, etc., in the wafer.

[Patent Document 1]: Japanese Laid-open Patent Publication No. 2010-251655

[Patent Document 2]: Japanese Laid-open Patent Publication No. 2013-179287

SUMMARY OF THE PRESENT DISCLOSURE

An object of one aspect of the present disclosure is to cause a service life of a device formed on a substrate to be longer and achieve a higher throughput.

According to an embodiment of the invention, there is provided a substrate storing method for a substrate processing apparatus including a process module in which a substrate is processed, a first substrate storing container, a second substrate storing container, and a transferring module that conveys the substrate between locations connected by the transferring module, wherein the process module, the first substrate storing container, and the second substrate storing container are connected by the transferring module, the method including the successive steps of, conveying an unprocessed substrate stored in the first substrate storing container to the second substrate container, conveying the unprocessed substrate stored in the second substrate storing container to the process module to process the unprocessed substrate, conveying the processed substrate processed in the process module to the first substrate storing container, and introducing inactive gas into the first substrate storing container.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 3 is a flowchart illustrating an example substrate storing method.

DETAILED DESCRIPTION OF PREFERRED EMBODIMENTS

Figure 1A:
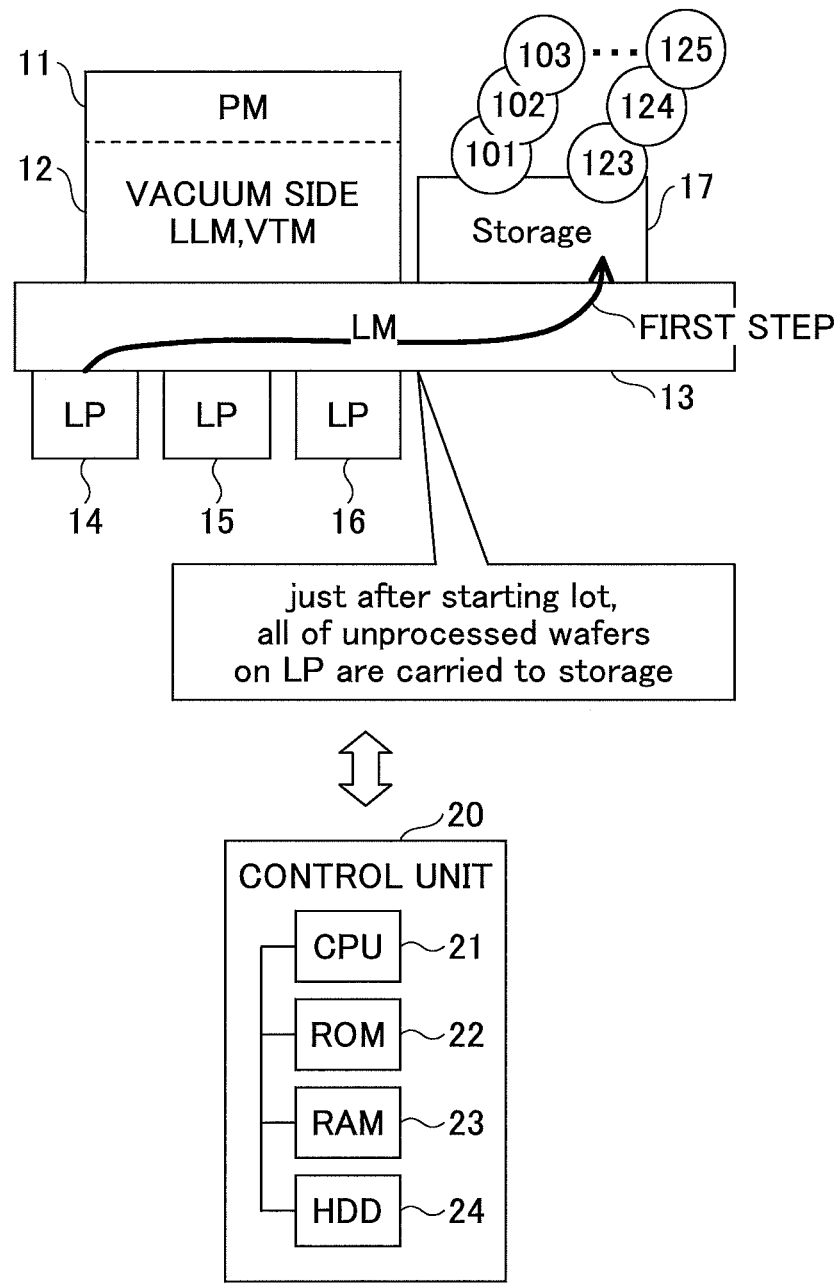
FIG. 1A is a diagram illustrating an example substrate processing apparatus and an example substrate storing method.

Herein below, embodiments will be described with reference to the accompanying drawings. Additionally, in the present specification and drawings, identical reference numerals will be applied to elements or the like that have substantially similar functions and configurations to those in another embodiment, and descriptions thereof may be omitted.

Substrate Processing Apparatus

Figure 1B:
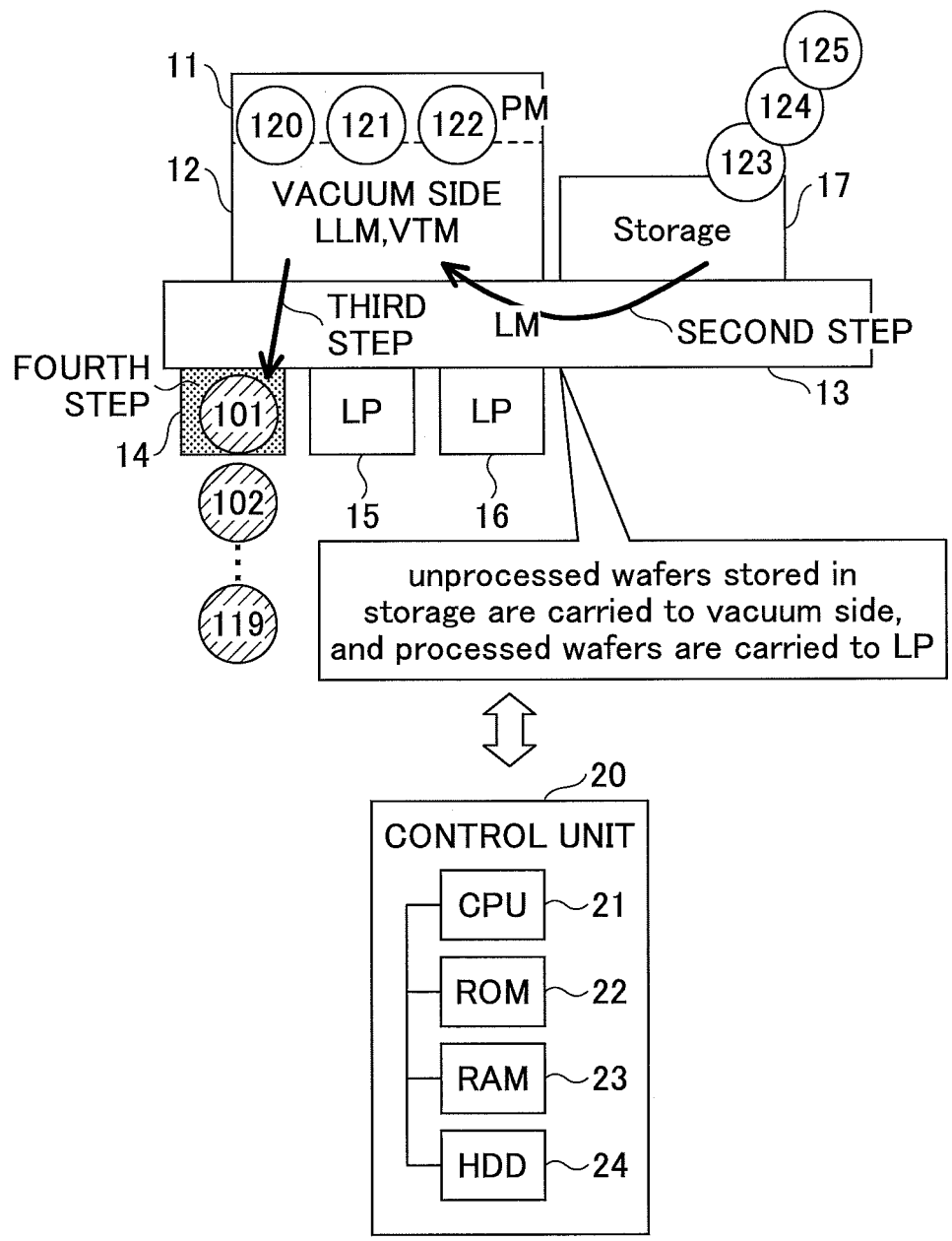
FIG. 1B is another diagram illustrating an example substrate processing apparatus and an example substrate storing method.

First, an example configuration of a substrate processing apparatus of an embodiment of the present invention will be described with reference to FIG. 1A and FIG. 1B. The substrate processing apparatus includes a process module (PM) 11, a LLM/VTM (Vacuum Transfer Module: VTM/Load Lock Module: LLM) 12, a loader module (LM) 13, three load ports 14-16 and a storage 17.

The process module 11 performs a predetermined process on a wafer. A number of process modules 11 may be one or more. The process module 11 is arranged so as to be connected with the LLM/VTM 12. A gate valve capable of being opened and closed is provided between the process module 11 and the LLM/VTM 12, and thereby being kept the process module 11 and the LLM/VTM 12 in a certain vacuum state respectively. In the process module 11, a plasma or non-plasma etching process, film forming process, cleaning process, ashing process, etc., are performed on the wafers while the process module 11 is depressurized to a vacuum atmosphere.

A load lock module LLM of the LLM/VTM 12 is arranged between a common transfer module VTM and a loader module LM in the LLM/VTM 12. The load lock module LLM and the common transfer module VTM are connected where a gate valve capable of being opened and closed is provided between them. The load lock module LLM switches a vacuum atmosphere and an air atmosphere, and carries the wafer from the loader module LM at the air side to the common transfer module VTM at the vacuum side, or from the common transfer module VTM at the vacuum side to the loader module LM at the air side.

The three load ports 14-16 are disposed on a side wall of the loader module 13 along a longitudinal direction thereof. For example, a FOUP with 25 wafers therein or an empty FOUP is disposed on the respective load ports 14-16. A wafer before being processed (hereinafter referred to as unprocessed wafer) is carried from the FOUP on the load ports 14-16 to the process module 11. A wafer after being processed in the process module 11 (hereinafter referred to as processed wafer) is returned to the FOUP from which it has been carried. A number of the load ports may be one or more. A transfer apparatus for holding and carrying the wafer is disposed in the loader module LM and the LLM/VTM 12.

The storage 17 stores the wafer temporary. The storage 17 has a space wider than respective load ports 14-16, and the storage 17 capable of storing more wafers than the load ports 14-16. The storage 17 may be provided in the loader module 13.

Additionally, the load ports 14-16 are examples of first substrate storing container, and the storage 17 is an example of second substrate storing container. The LLM/VTM 12 and the loader module 13 are examples of transferring module for transferring the wafer.

A control unit 20 includes a CPU (Central Processing Unit) 21, a ROM (Read Only Memory) 22, a RAM (Random Access Memory) 23 and a HDD (Hard Disk Drive) 24. Additionally, the control unit 20 may include a memory device other than the HDD 24, such as a SSD (Solid State Drive).

The CPU 21 performs wafer processing in the process module 11 according to a recipe in which steps and conditions of the process are set. The HDD 24 stores a process recipe setting the steps and conditions of the process. However, the process recipe may be stored in the ROM 22 or RAM 23. A program for performing substrate storing method (described below) may be stored in the HDD 24 or RAM 23. The process recipe and the program for performing substrate storing method may be recorded in recording media to be distributed. Also, the process recipe and the program may be provided from an external apparatus via a network. Additionally, functions of the control unit 20 may be achieved by an operation of software or by an operation of hardware.

<$N_2$ Purging>

When the wafer is carried into the FOUP on the load ports 14-16, outgas from one processed wafer reacts with outgas from another processed wafer, and defect or change of device characteristics may occur in the device formed on the wafer W.

Therefore, in the present embodiment, $N_2$ purging for replacing gas in the FOUP with $N_2$ (nitrogen) gas by introducing the $N_2$ gas into the load ports 14-16 is performed so as to extend a service life of the device formed on the wafer. Inactive gas such as Ar (argon) gas may be introduced instead of the $N_2$ gas. Thus, the outgas from the wafer can be evacuated outside the load ports 14-16. Also, the $N_2$ gas may be introduced into the storage 17 to perform the $N_2$ purging so as to replace the gas in the storage 17 with the $N_2$ gas.

Substrate Storing Method: Example Comparison

Figure 2A:
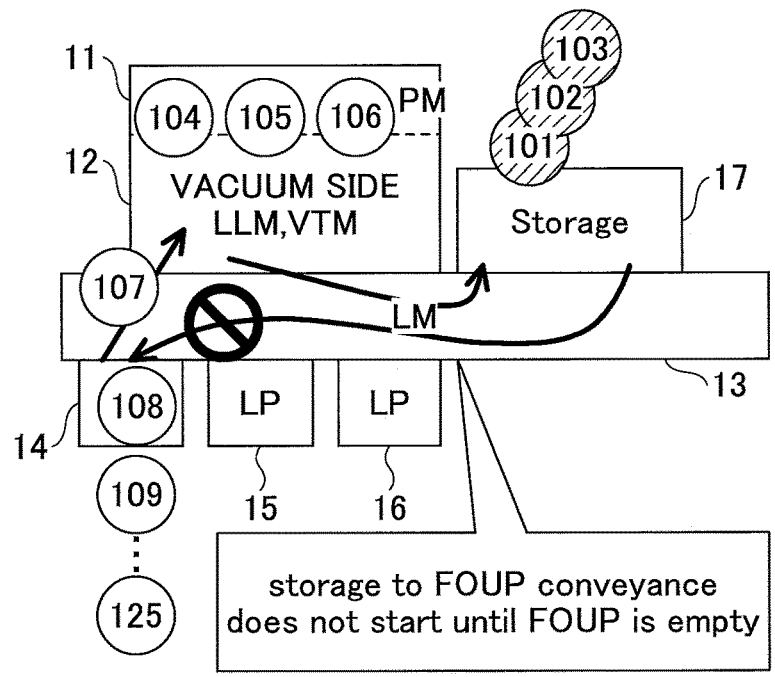
FIG. 2A is a diagram illustrating a substrate storing method of an example comparison.
Figure 2B:
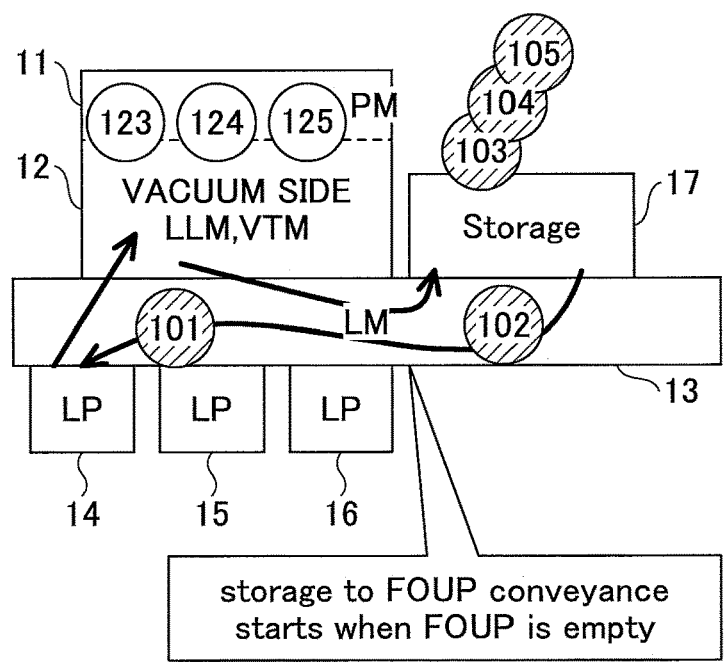
FIG. 2B is another diagram illustrating a substrate storing method of an example comparison.

Here, a substrate storing method of example comparison is described with reference to FIG. 2A and FIG. 2B. In the substrate storing method of example comparison, the unprocessed wafers 101, 102, etc., in the FOUP on the load port 14 are carried to the vacuum side in that order to be processed in the process module 11, and the processed wafers 101, 102, etc., are carried to the storage 17 in that order. The processed wafers 101, 102, etc., are returned to the FOUP on the load port 14 from which they have been carried.

When the processed wafer is carried from the storage 17 to the FOUP on the load port 14, determination whether an unprocessed wafer is remained in the FOUP on the load port 14 is performed. As shown in FIG. 2A, when the unprocessed wafer is remained in the FOUP, the wafers 101, 102, etc., are not carried from the storage 17 to the FOUP. On the other hand, as shown in FIG. 2B, when the FOUP is empty, the wafers 101, 102, etc., are carried from the storage 17 to the FOUP.

The service life of the device formed on the wafer is reduced as the time during which the processed wafer is kept in the storage 17 becomes longer because of the defects of the wafer or change of characteristics of the device. For example, the replacement of gas by the $N_2$ purging can be performed more locally in the load ports 14-16 in comparison to the storage 17. Thus, the occurrence of the defects, etc., can be more effectively suppressed in the load ports 14-16. Therefore, preferably, the time during which the wafer is kept in the storage 17 is reduced and the processed wafer is returned to the FOUP on the load ports 14-16 as soon as possible, in order to extend the service life of the wafer. Hence, in the present embodiment, the substrate is carried in the substrate storing method described below.

Substrate Storing Method: Embodiment of Invention

The substrate storing method of the present embodiment of the invention will be described with reference to FIG. 1A-FIG. 3. FIG. 3 is a flow chart illustrating an example substrate storing process of the present embodiment. FIG. 1A and FIG. 1B are diagrams illustrating an example substrate storing method using the substrate processing apparatus of the present embodiment.

Upon the substrate storing process shown in FIG. 3 being started, the control unit 20 performs a process for carrying the unprocessed wafer stored in the FOUP on the load port to the storage 17 (step S10: first step). For example, as shown in FIG. 1A, just after starting the process of the substrate processing apparatus on a lot, the unprocessed wafers in the FOUP on the load port 14 is started to be carried, and all of the unprocessed wafers 101-125 are carried to the storage 17 and stored therein.

The controller 20 determines whether the FOUP is empty or not (step S12). The controller 20 waits until the FOUP becomes empty. Upon the FOUP being determined to be empty (no wafer remaining in the FOUP), the unprocessed wafers stored in the storage 17 are carried to the process module 11 through the loader module 13 and the LLM/VTM 12, and thereby performing a predetermined process on the unprocessed wafers in the process module 11 (step S14: second step).

Then, the processed wafers are carried from the process module 11 to the FOUP from which they are carried (step S16: third step). The controller 20 performs a process for introducing the $N_2$ gas into the FOUP (step S18: fourth step), and the process is terminated. Additionally, the $N_2$ gas may be introduced in the FOUP before the operation of the third step, or the $N_2$ gas introduction may be performed in parallel with the third step. Thus, as shown in FIG. 1B, the processed wafers are not mixed with the unprocessed wafers and stored in the FOUP on the load port 14, where the $N_2$ purging has been performed in the FOUP on the load port 14.

As described above, according to the substrate storing method of the present embodiment, the processed wafers can be stored in the $N_2$ purged FOUP (in which the $N_2$ purging has been performed) avoiding the mixture of the processed wafers and unprocessed wafers in the FOUP, thereby suppressing the occurrence of the defects, etc., in the wafers. Hence, the service life of the devices formed on the wafers can be extended.

Specifically, by carrying all of the unprocessed wafers on the load port to the storage 17 just after starting the lot, the processed wafers can be more quickly returned to the $N_2$ purged FOUP on the load port, from which they have been carried, whereas the mixture of the processed wafers and the unprocessed wafers can be avoided. Thus, the $N_2$ purging can be performed more effectively so as to suppress the occurrence of the defects and change of characteristics of the device, thereby extending the service life of the wafer.

Also, according to the substrate storing method of the present embodiment, an improved throughput can be achieved. In a conventional process sequence, the wafers are returned from the storage to the FOUP after the FOUP becomes empty. In such a method, time taken for carrying all of the unprocessed wafers from the FOUP becomes longer as the wafer processing time in the process module 11 becomes longer. Therefore, an operation for having the wafers return to the FOUP starts later. On the contrary, in the substrate storing method of the present embodiment, the wafers can be returned to the FOUP without being rate-controlled by the processing time in the process module 11 because the FOUP becomes empty when the first wafer is processed in the process module 11 regardless of the processing time in the process module 11. Thus, the throughput can be improved.

Timing of Carrying

In the substrate storing method of the embodiment described above, the unprocessed wafers stored in the storage 17 may be carried to the process module 11 after all of the unprocessed wafers are carried outside the FOUP on the load port.

Variation 1

The unprocessed wafers stored in the storage 17 may be carried to the process module 11 before all of the unprocessed wafers in the FOUP have been carried to the storage 17. For example, upon a number of the unprocessed wafers in the FOUP being a predetermined number (e.g., 1-several), the unprocessed wafers stored in the storage 17 may be carried to the process module 11. Thus, the throughput can be improved.

Variation 2

Also, for example, a predetermined numbers of the unprocessed wafers lastly carried outside the FOUP may be directly carried to the process module 11 without being carried to the storage 17, and may be directly returned to the FOUP, from which they have been carried, after the process in the process module 11.

For example, the unprocessed wafers 125, 124, etc., may be carried to the storage 17 in that order, where the carrying operation is performed in descending sequence of the number (reference numeral) of the unprocessed wafers. Preferably, in order to improve the throughput, the last unprocessed wafer 101 is directly carried to the process module 11. Also, after being processed in the process module 11, preferably, the wafer 101 directly returned to the FOUP from which it has been carried, provided the FOUP has already become empty. The second last wafer 102 may be carried to the storage 17, or may be carried to the LLM/VTM 12 and carried to the process module 11 after the wafer 101 is processed. Preferably, similarly to the processed wafer 101, the processed wafer 102 is returned to the FOUP from which it has been carried. Further, the unprocessed wafer 103 and subsequent unprocessed wafers may be carried to the LLM/VTM 12, and the wafers may be sequentially carried to the process module 11. In this case, also, the processed wafers are preferably returned directly to the FOUP from which they have been carried in order to improve the throughput.

Figure 4A:
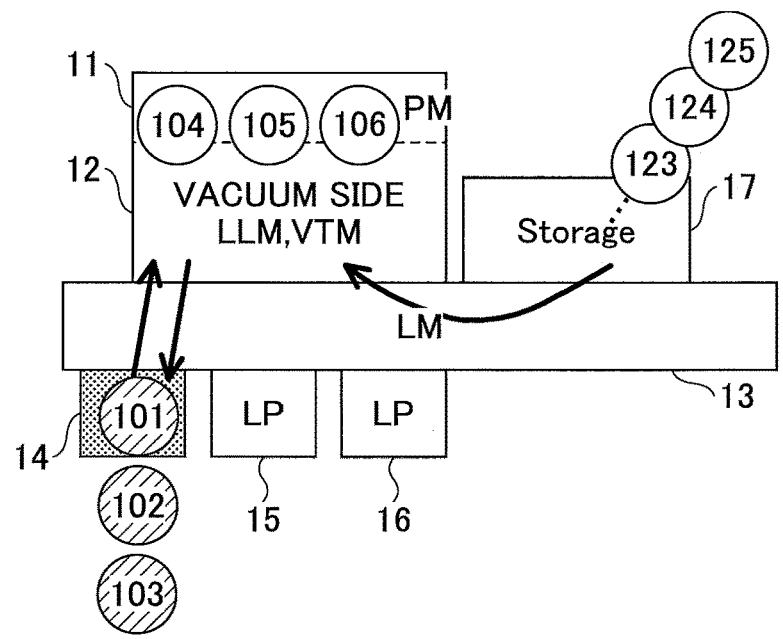
FIG. 4A is a diagram illustrating another example of the substrate storing method.

FIG. 4A is a diagram illustrating an example operation of three unprocessed wafers 101, 102 and 103 lastly carried outside the FOUP, which are directly carried to the process module 11 without going through storage 17 and returned directly to the FOUP, from which they have been carried, after the process in the process module 11. The unprocessed wafers 104-125 are carried from the FOUP to the storage 17, and further carried to the process module 11 after the unprocessed wafers 101, 102 and 103 are processed in the process module 11. The wafers 104-125 are returned to the FOUP, from which they have been carried, after the process in the process module 11. Thus, a number of the wafers carried to the process module 11 via the storage 17 can be reduced, thereby achieving a higher throughput.

Figure 4B:
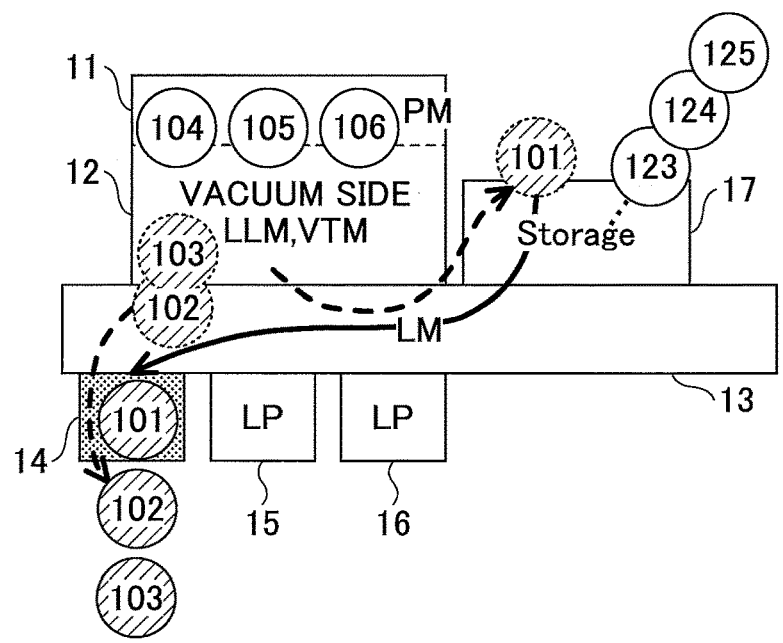
FIG. 4B is another diagram illustrating another example of the substrate storing method.

In a case where there is not any unprocessed wafer in the FOUP, the processed wafers 101, 102 and 103 are returned to the FOUP immediately after the process in the process module 11. On the other hand, as shown in FIG. 4B, in a case where there is any unprocessed wafer in the FOUP, the processed wafer 101 having been processed in the process module 11 is temporary stored in the storage 17. Then, after all of the unprocessed wafers in the FOUP have been carried outside, the processed wafer 101 may be returned from the storage 17 to the FOUP. In this case, in the storage 17, the processed wafer 101 is preferably disposed as far as possible from the unprocessed wafers. Thus, risks for causing the defects, etc., in the wafer can be reduced. The processed wafers 102 and 103, after being processed in the process module 11, are returned from the process module 11 directly to the FOUP to which the processed wafer 101 has been returned.

Variation 3

In a case where a plurality of the process modules 11 are provided, at least a number, corresponding to the number of the process-modules 11, of unprocessed wafers preferably carried directly to the process module 11, and returned to the FOUP, from which they have been carried, provided the FOUP has become empty, thereby achieving a higher throughput.

Variation 4

For example, in a case where different conditions are set for the process performed on the unprocessed wafers stored in the same FOUP, a transfer rout may be varied according to the conditions of the process. For example, in a case where there area process condition A and process condition B and the outgas is likely to be generated under condition A while the outgas is unlikely to be generated under condition B, the processed wafer on which the process of the condition A has been performed may be returned from the process module 11 directly to the FOUP since the wafer processed under condition A is likely to cause other wafer's the defects. Meanwhile, the processed wafer on which the process of the condition B has been performed may be carried from the 11 to the storage 17 so as to be temporary stored therein, and may be returned from the storage 17 to the FOUP. Thus, the processed wafer that is likely to cause other wafer's defect due to the outgas can be returned to the FOUP as quickly as possible, thereby reducing a time during which processed wafers respectively processed under different conditions are mixed in the FOUP. In this way, effectiveness of $N_2$ purging in the FOUP can be improved and the service life of the devices on the wafers can be extended.

Figure 5A:
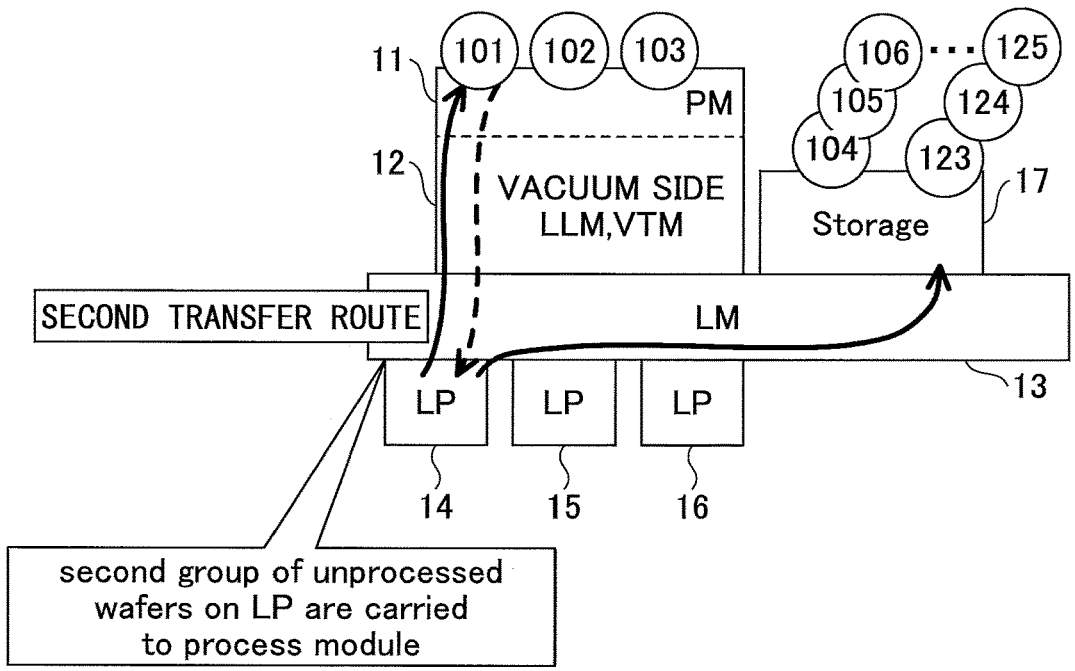
FIG. 5A is a diagram illustrating still another example of the substrate storing method.

For example, as shown in FIG. 5A, the wafers 101-103 processed under the condition A are carried directly to the process module 11, where the processed wafer under the condition A is likely cause other wafer's defect due to the outgas therefrom. After being processed, the wafers 101-103 may be returned directly to the FOUP via a second transfer route.

Figure 5B:
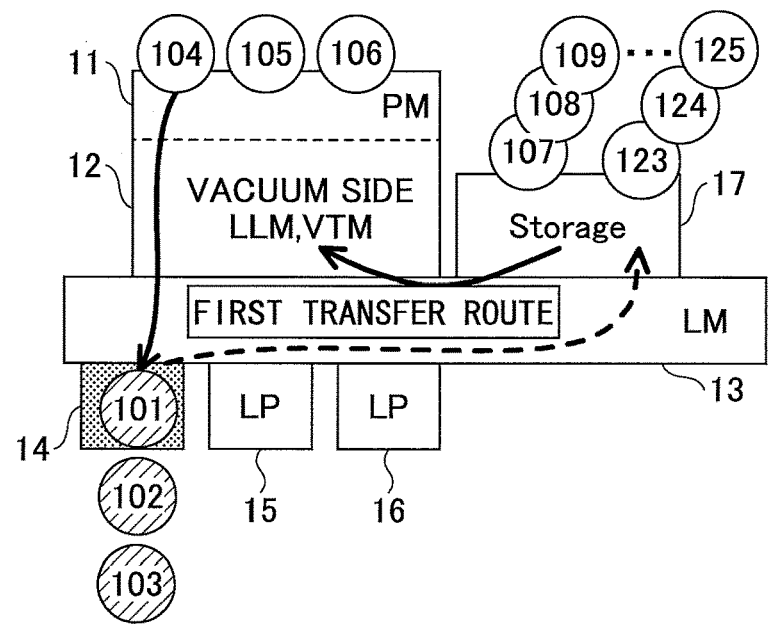
FIG. 5B is another diagram illustrating still another example of the substrate storing method.

On the other hand, as shown in FIG. 5A and FIG. 5B, the wafers 104-125 processed under the condition B may be transferred via a first transfer route, where the wafers are carried from the storage 17 to the process module 11 and returned to the FOUP (in a sequence of storage 17, process module 11, and FOUP), and where the processed wafer under the condition B is unlikely to cause other wafer's defect due to the outgas therefrom. The transfer route of the wafers 104-125 may be changed to be carried from the storage 17 to the process module 11 and returned to the FOUP via the storage 17 (in a sequence of storage 17, process module 11, storage 17, and FOUP).

Herein above, although the substrate storing method and the substrate processing apparatus have been described with respect to a above described embodiment for a complete and clear disclosure, the substrate storing method and the substrate processing apparatus are not to be thus limited but are to be construed as embodying all modifications and alternative constructions within a range of the present invention. Also, the above described embodiments and a modification or alternative construction may be combined without including inconsistency.

For example, the substrate storing method of an embodiment of the present invention may be applied to a substrate processing apparatus including a plurality of (e.g., six) process modules, or a parallel-type substrate processing apparatus including two process modules. In the process modules, plasma processing or heat treatment is performed on the wafer. In a case where the plasma processing is performed on the wafer, a Capacitively Coupled Plasma (CCP) processing apparatus, an Inductively Coupled Plasma (ICP) processing apparatus, a plasma processing apparatus using a radial line slot antenna, a Helicon Wave Plasma (HWP) processing apparatus, and an Electron Cyclotron Resonance Plasma (ECR) processing apparatus may be used.

In the embodiments described above, although the etching process is performed on a semiconductor wafer W, the etching process may be performed on various types of substrates used for a LCD(Liquid Crystal Display), a FPD (Flat Panel Display), a photomask, a CD substrate, a printed substrate, and the like.

What is claimed is:

1. A substrate storing method for a substrate processing apparatus including a process module in which a substrate is processed, a first substrate storing container, a second substrate storing container, and a transferring module that conveys the substrate between locations connected by the transferring module, wherein the process module, the first substrate storing container, and the second substrate storing container are connected by the transferring module, the method comprising the successive steps of:

a first conveying of one or more unprocessed substrates stored in the first substrate storing container to the second substrate storing container except for a predetermined number of unprocessed substrates in the first substrate storing container, said predetermined number being equal to or larger than 1;

a second conveying of the unprocessed substrates stored in the second substrate storing container to the process module to process the unprocessed substrates;

a third conveying of the processed substrates processed in the process module to the first substrate storing container; and introducing inactive gas into the first substrate storing container, wherein the successive steps further comprise:

conveying the predetermined number of unprocessed substrates to the process module to process the predetermined number of unprocessed substrates without being conveyed to the second substrate storing container, the predetermined number of unprocessed substrates being lastly conveyed outside the first substrate storing container among the unprocessed substrates stored in the first substrate storing container, conveying the predetermined number of substrates processed in the process module to the first substrate storing container, and detecting that no unprocessed substrate remains in the first substrate storing container before the second conveying.

2. The substrate storing method according to claim 1, wherein in the third conveying, the processed substrates are conveyed from the process module to the first substrate storing container after the detecting that no unprocessed substrate remains in the first substrate storing container.

3. The substrate storing method according to claim 1, wherein in the third conveying, the processed substrates are optionally conveyed from the process module to the second substrate storing container in response to detecting that any of the unprocessed substrates remain in the first substrate storing container, and the processed substrates in the second substrate storing container starts to be conveyed to the first substrate storing container after all of the unprocessed substrates have been conveyed outside the first substrate storing container.

4. The substrate storing method according to claim 1, wherein
in the second conveying,
the unprocessed substrates in the second substrate storing container starts to be conveyed to the process module after all of the unprocessed substrates have been conveyed outside the first substrate storing container.

5. The substrate storing method according to claim 1, wherein the successive steps further comprise introducing the inactive gas into the second substrate storing container upon performing the first conveying.

6. The substrate storing method according to claim 1, wherein the introducing inactive gas into the first substrate storing container is performed concurrently with the third conveying of the processed substrates.

7. The substrate storing method according to claim 1, wherein the conveying the predetermined number of substrates processed in the process module to the first substrate storing container is performed by conveying the predetermined number of substrates directly to the first substrate storing container without conveying the predetermined number of substrates to the second substrate storing container.

* * * * *